United States Patent
Koh

(10) Patent No.: US 10,721,341 B2
(45) Date of Patent: Jul. 21, 2020

(54) SUPPORT FOR MOBILE DEVICE

(71) Applicant: Cornerstone Co., Ltd., Seoul (KR)

(72) Inventor: Hyun Lim Koh, Seoul (KR)

(73) Assignee: Cornerstone Co. Ltd., Seoul (KR)

( * ) Notice: Subject to any disclaimer, the term of this patent is extended or adjusted under 35 U.S.C. 154(b) by 0 days.

(21) Appl. No.: 16/219,884

(22) Filed: Dec. 13, 2018

(65) Prior Publication Data

US 2020/0162593 A1 May 21, 2020

(30) Foreign Application Priority Data

Nov. 16, 2018 (KR) .................. 10-2018-0142090

(51) Int. Cl.
*H04M 1/02* (2006.01)
*H05K 5/02* (2006.01)

(52) U.S. Cl.
CPC .......... *H04M 1/026* (2013.01); *H05K 5/0204* (2013.01); *H05K 5/0208* (2013.01)

(58) Field of Classification Search
CPC ... H04M 1/026; H05K 5/0204; H05K 5/0208; F16M 11/28; F16M 11/10; F16M 13/02; F16M 13/04; F16M 11/02; F16M 11/04; F16B 2/12; G03B 17/56; A47F 5/00
See application file for complete search history.

(56) References Cited

U.S. PATENT DOCUMENTS

| | | | | |
|---|---|---|---|---|
| 10,247,353 B1* | 4/2019 | Chen | ............. | F16M 11/28 |
| 10,426,261 B2* | 10/2019 | Theis | ............. | F16M 11/041 |
| 2010/0320339 A1* | 12/2010 | Fan | ............. | F16M 11/10 248/125.8 |
| 2012/0168576 A1* | 7/2012 | Intravatola | ............. | F16M 11/10 248/125.8 |
| 2014/0246547 A1* | 9/2014 | Intravatola | ............. | H04R 1/026 248/125.8 |
| 2015/0374117 A1* | 12/2015 | Lozano | ............. | A47B 19/06 320/107 |
| 2016/0230921 A1* | 8/2016 | Fan | ............. | F16M 11/105 |
| 2018/0149344 A1* | 5/2018 | Cornell | ............. | F21V 21/06 |
| 2018/0347726 A1* | 12/2018 | Anderson | ............. | F16L 3/20 |
| 2018/0356032 A1* | 12/2018 | Crider | ............. | F16B 2/005 |
| 2019/0185182 A1* | 6/2019 | Bei | ............. | B64D 47/08 |
| 2019/0293229 A1* | 9/2019 | Okuda | ............. | G09F 9/00 |
| 2019/0316709 A1* | 10/2019 | Chan | ............. | F16M 11/28 |
| 2019/0360671 A1* | 11/2019 | Gall | ............. | F21V 21/22 |
| 2020/0032950 A1* | 1/2020 | Abraham | ............. | F16M 11/247 |

* cited by examiner

*Primary Examiner* — Khawar Iqbal

(57) ABSTRACT

A support for a mobile device which is provided on a mounted portion of a mobile device or a case of the mobile device to support the mobile device, includes: a fixing portion provided on the mounted portion; an extending portion extended while being drawn in or out in a longitudinal direction; a rotating portion provided between the fixing portion and the extending portion to relatively rotate the fixing portion; and an end support portion rotatably provided at an end of the extending portion.

2 Claims, 4 Drawing Sheets

[FIG. 1]
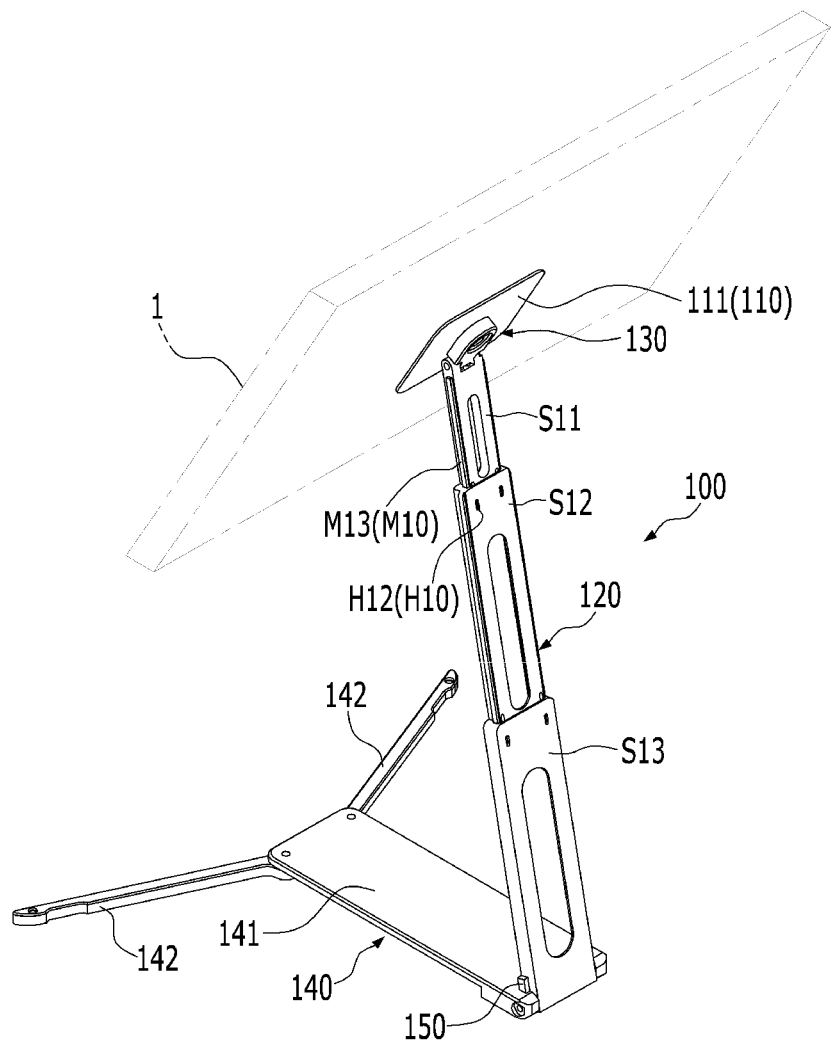

[FIG. 2]
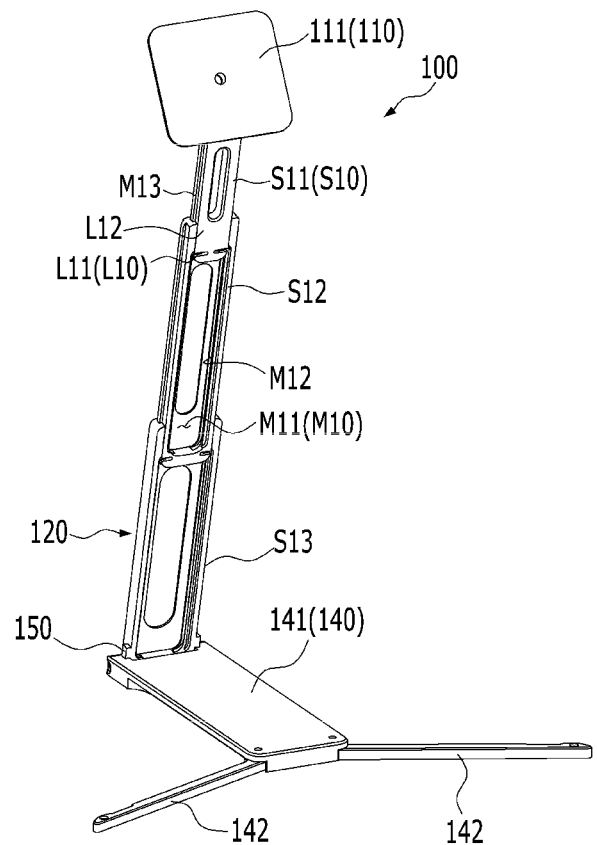
[FIG. 3]
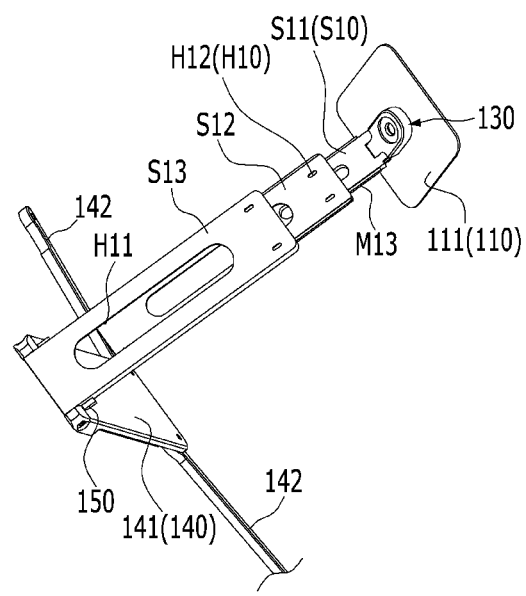

[FIG. 4]
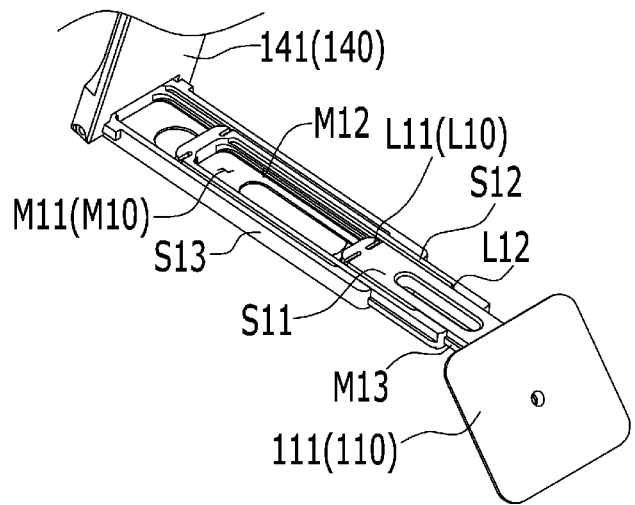
[FIG. 5]
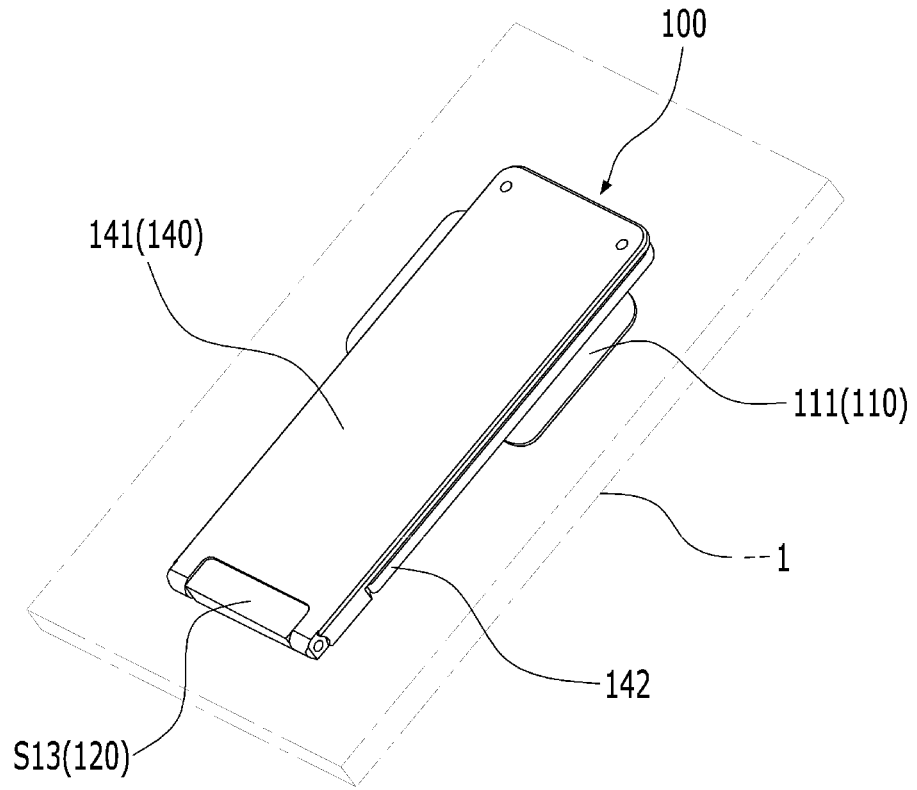

[FIG. 6]
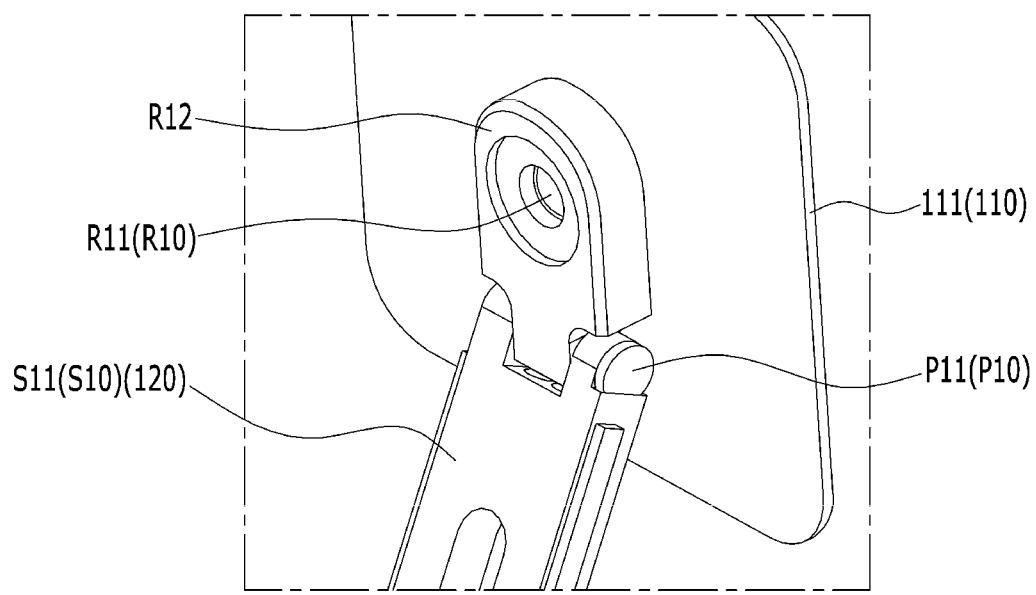
[FIG. 7]
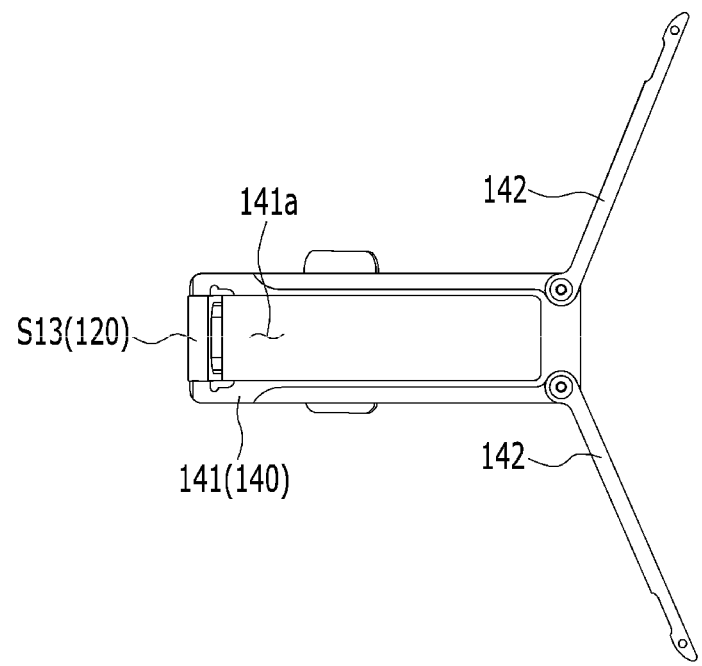

SUPPORT FOR MOBILE DEVICE

TECHNICAL FIELD

The present invention relates to a support for a mobile device.

BACKGROUND ART

Generally, a support for a mobile device is a device for supporting a mobile device such as a smart phone or a tablet PC to allow a user to use more conveniently the mobile device.

The support for the mobile device may be classified into a fixture-supported support which is placed on a fixture such as a table to support the mobile device, a hand-supported support which is inserted to a hand such as a finger to support the mobile device, and a bellows-connected support which uses a long bending allowable member (so called "bellows") to support the mobile device.

Specifically, the fixture-supported support is configured by one body and includes a support surface on which the mobile device is placed, an inclined surface which supports the bottom of the mobile device to provide an inclination angle to the mobile device placed on the support surface, and a bottom surface which is in surface contact with the fixture. The hand-supported support includes a case for holding the mobile device, a fixing plate attached to the bottom of the case through an adhesive tape or the like, and a metallic finger ring provided on the fixing plate to insert a user's finger. The bellows-connected support includes a fixing portion fixed to the fixture such as a table or the like, a holding portion for holding the mobile device, and a bending allowable member which connects the fixing portion and the holding portion and has an elongated shape, in which a bendable structure is elongated therein and an exterior is enclosed by an outer cover made of rubber or the like.

However, in existing supports for the mobile device, in the case of the existing fixture-supported support, there is a problem in that it is inconvenient in use because a thick book or the like needs to be filed below the mobile device in order to adjust a height of the mobile device such as adjusting the mobile device to the eye level, and in the case of the existing hand-supported support, there is a problem in that the adjusting to the eye level is easy, but it is difficult to use the mobile device for a long time due to the limitation of the power of the hand or arm that can be supported by the user. In addition, in the case of the existing bellows-connected support, there is a problem in that the portability is poor, and the support falls below an expected position due to the weight of the mobile device and rotates based on a fixed end while falling due to a cantilever structure, and thus, it is difficult to adjust the position such that the support needs to be lifted above the expected position in order to adjust an accurate eye level, and the support is further twisted in an opposite direction to the rotation direction than the expected position by considering the rotation.

DISCLOSURE

Technical Problem

An object of the present invention provides a support for a mobile device capable of easily adjusting the position of the mobile device to a desired position, maintaining the mobile device at the adjusted position for a long time, and easily carrying the support together with the mobile device during carrying.

Technical Solution

In order to achieve the objects, an embodiment of the present invention provides a support for a mobile device which is provided on a mounted portion of a mobile device or a case of the mobile device to support the mobile device, including: a fixing portion provided on the mounted portion; an extending portion extended while being drawn in or out in a longitudinal direction; a rotating portion provided between the fixing portion and the extending portion to relatively rotate the fixing portion; and an end support portion rotatably provided at an end of the extending portion.

As an example, the fixing portion may include a fixing member provided with the rotating portion on one surface thereof; and a double-sided tape attaching the other surface of the fixing member to the mounted portion.

As another example, the fixing portion may include a fixing member provided with the rotating portion on one surface thereof; a magnet provided on any one of the other surface of the fixing member and the mounted portion; and a magnet response member which is provided on the other one of the other surface of the fixing member and the mounted portion and made of a material responding to the magnet.

As yet another example, the fixing portion may include a first fixing member attached to the mounted portion through the double-sided tape; and a second fixing portion having one surface detachably provided on the first fixing portion and the other surface having the rotating portion.

The extending portion may have a slidable structure in which a plurality of sliding members having a plate shape and different widths are drawn in or out to or from each other.

The extending portion may include a first sliding member of which one end is provided on the rotating portion; a second sliding member having a width larger than the first sliding member; and a moving guide portion which guides the sliding of the first sliding member to the second sliding member in a longitudinal direction thereof.

The moving guide portion may include a drawing in-out receiving portion which is provided in the second sliding member so that the first sliding member is drawn in or out in a received form; a guide groove which is provided on any one of an inner surface of the drawing in-out receiving portion and an outer surface of the first sliding member; and a guide protrusion which is provided on the other one of the inner surface of the drawing in-out receiving portion and the outer surface of the first sliding member so as to correspond to the guide groove.

The extending portion may further include a slip-off preventing portion which prevents the slip-off of the first sliding member from the second sliding member while the first sliding member is maximally drawn out from the second sliding member.

The slip-off preventing portion may include a latching member provided on any one of the outer surface of the first sliding member and the inner surface of the second sliding member; and a latching jaw provided on the other one of the outer surface of the first sliding member and the inner surface of the second sliding member so as to latch the latching member.

The extending portion may further include a moving stop portion which stops the movement of the first sliding member while the first sliding member is drawn out from the second sliding member.

The moving stop portion may include a stop protrusion elastically supporting any one of the first sliding member and the second sliding member; and at least one stop groove formed at the other one of the first sliding member and the second sliding member so as to be inserted with the stop protrusion.

The extending may further include a third sliding member which has a width larger than the second sliding member and guides the second sliding member to be movable in a longitudinal direction thereof.

The rotating portion may include a roll rotating portion which is provided on the fixing portion and rotate the fixing portion clockwise or counterclockwise to implement a roll motion with respect to the mobile device; and a pitch rotating portion which is provided on the roll rotating portion and tilts the roll rotating portion in a vertical direction to implement a pitch motion with respect to the mobile device.

The roll rotating portion may include a roll hinge shaft provided on the fixing portion; and a roll rotating member rotatably provided on the roll hinge shaft.

The pitch rotating portion may include a pitch hinge shaft provided on the front end of the extending portion; and a rotation guiding hole which is provided on the roll rotating member and rotatably inserted with the pitch hinge shaft.

The end support portion may be rotated in the forward direction at the end of the extending portion to cover the extending portion when the extending portion is drawn in and rotated in the backward direction at the end of the extending portion to support the extending portion when the extending portion is drawn out.

The end support portion may include an end support member rotatably provided at the end of the extending portion; and a support area expanding member which is rotatably provided on the end support member and separated from one side of the end support member in the case of supporting the extending portion to expand a support area.

The end support member may include a receiving groove for the extending portion which is recessed in a surface facing the extending portion so as to receive the extending portion in the case of covering the extending portion.

The support for the mobile device according to the embodiment of the present invention may further include an inclination retention protrusion which is provided at the end of the extending portion so that the end support portion is held to the extending portion in an inclined form when the end support portion is rotated in a backward direction at the end of the extending portion.

Another embodiment of the present invention provides a support for a mobile device which is provided on a mounted portion of a mobile device or a case of the mobile device, including a fixing portion provided on the mounted portion; an extending portion which is provided on the fixing portion and extended while being drawn in or out in a longitudinal direction; and an end support portion rotatably provided at an end of the extending portion.

Advantageous Effects

As described above, the support for the mobile device according to the embodiment of the present invention may have the following effects.

According to the embodiment of the present invention, since there is provided the technical configuration including the fixing portion, the extending portion, the rotating portion, and the end support portion, it is possible to easily adjust the position of the mobile device to a desired position of the user by stretching or contracting the length of the extending portion in a longitudinal direction of the extending portion, maintain the mobile device at the adjusted position for a long time by supporting of the extending portion and the end support portion, and easily carry the support together with the mobile device during carrying by rotating the end support portion to cover the extending portion after minimizing the length of the extending portion.

Further, since the extending portion has a slidable structure in which a plurality of sliding members having a plate shape and different widths are drawn in or out each other, it is possible to implement thinly the thickness of the support for the mobile device through the plate shape and easily adjust the length thereof when the extending portion is pulled in the longitudinal direction to be extended and pressed in an opposite direction to be contracted.

Further, since there is provided the technical configuration that the extending portion includes the first sliding member, the second sliding member, and the moving guide portion, the first and second sliding member may be smoothly drawn in or out to or form each other in the longitudinal direction without moving left and right through the moving guide portion.

Further, since there is provided the technical configuration that the first sliding member is drawn in or out while being received in the drawing in-out receiving portion provided in the second sliding member, the even if the first and second sliding members are drawn in to each other to overlap with each other, it is possible to minimize the thickness of the extending portion, and eventually implement a smaller thickness of the support for the mobile device of the present invention.

Further, since there is provided the technical configuration that the extending portion further includes the slip-off preventing portion, it is possible to prevent the slip-off of the first sliding member from the second sliding member even if the first sliding member is pulled by the user to be maximally drawn out from the second sliding member.

Further, since there is provided the technical configuration that the extending portion further includes the moving stop portion, it is possible to stop the movement of the first sliding member while the first sliding member is drawn out from the second sliding member to prevent the first sliding member from sliding downward along the second sliding member by the load. Particularly, in the case where a plurality of stop grooves is provided at intervals in the longitudinal direction of the first sliding member, the stop protrusion is selectively inserted to any one of the plurality of stop grooves to stop the movement at a desired position of the user.

Further, since there is provided the technical configuration that the extending portion further includes the third sliding member, it is possible to drawn out the extending portion to a sufficient length through the third sliding member.

Further, since there is provided the technical configuration that the rotating portion includes the roll rotating portion, it possible to rotate the fixing portion clockwise or counterclockwise when viewing a display of the mobile device from the front side to implement a roll motion with respect to the mobile device.

Further, since there is provided the technical configuration that the rotating portion includes the pitch rotating portion, it possible to tilt the roll rotating portion in a vertical direction when viewing the mobile device from the side to implement a pitch motion with respect to the mobile device.

Further, as an example, since the double-sided tape is provided as the fixing portion, it is possible to firmly fix the support for the mobile device of the present invention to the mounted portion of the mobile device or the case of the mobile device through attachment. As another example, since the magnet or the like is provided as the fixing portion, it is possible to firmly fix the support for the mobile device through a magnetic force and detach the support for the mobile device by applying an external force larger than the magnetic force to mount and use the support for the mobile device of the present invention only when necessary. As yet another example, since the first and second fixing portions detached from each other are provided as the fixing portion, when the first and second fixing members are detachable from each other and the first fixing member remaining on the mounted portion during detaching is selected as a material such as plastic or the like which is not obstructed by wireless charging, it is possible to smoothly perform the wireless charging through a wireless charger.

Further, since there is provided the technical configuration that the end support portion is provided to be rotatable in forward and backward directions at the end of the extending portion, the end support portion may be rotated in the forward direction at the end of the extending portion to cover the extending portion when the extending portion is drawn in and rotated in the backward direction at the end of the extending portion to support the extending portion when the extending portion is drawn out.

Further, since there is provided the technical configuration that the end support member includes the end support member and the support area expanding member provided to be rotatable thereto, it is possible to rotate the support area expanding member in a separated direction at one side of the end support member to expand the support area, thereby more stably supporting the mobile device.

Further, since there is provided the technical configuration that the receiving groove for the extending portion is formed on the end support member, when the end support member covers the extending portion after the extending portion is fully drawn in, the extending portion may be received in the receiving groove for the extending portion, thereby minimizing the thickness of the support for the mobile device of the present invention during carrying.

DESCRIPTION OF DRAWINGS

FIG. 1 is a bottom perspective view schematically illustrating a support for a mobile device according to an embodiment of the present invention.

FIG. 2 is a front perspective view schematically illustrating the support for the mobile device of FIG. 1.

FIG. 3 is a view schematically illustrating a state in which an extending portion of the support for the mobile device of FIG. 1 is inserted.

FIG. 4 is a view of the extending portion of FIG. 3 which is viewed from a different direction so that a moving guide portion and the like of the extending portion are shown.

FIG. 5 is a view schematically illustrating a state in which the extending portion is fully inserted and then covered by an end support member.

FIG. 6 is a view schematically illustrating a rotating portion.

FIG. 7 is a view schematically illustrating a lower surface of the end support member of the support for the mobile device of FIG. 1.

MODES OF THE INVENTION

Hereinafter, embodiments of the present invention will be described in detail with reference to the accompanying drawings so as to easily implement those with ordinary skill in the art to which the present invention pertains. However, the present invention may be embodied in many different forms and are limited to embodiments described herein.

FIG. 1 is a bottom perspective view schematically illustrating a support for a mobile device according to an embodiment of the present invention and FIG. 2 is a front perspective view schematically illustrating the support for the mobile device of FIG. 1. FIG. 3 is a view schematically illustrating a state in which an extending portion of the support for the mobile device of FIG. 1 is inserted and FIG. 4 is a view of the extending portion of FIG. 3 which is viewed from a different direction so that a moving guide portion and the like of the extending portion are shown. FIG. 5 is a view schematically illustrating a state in which the extending portion is fully inserted and then covered by an end support member, FIG. 6 is a view schematically illustrating a rotating portion, and FIG. 7 is a view schematically illustrating a lower surface of the end support member of the support for the mobile device of FIG. 1.

As illustrated in FIGS. 1 to 7, a support 100 for a mobile device according to an embodiment of the present invention is a support for the mobile device which is provided on a mounted portion 1 of the mobile device or a case of the mobile device to support the mobile device 1 (hereinafter, designating the same reference numeral as the mounted portion) and includes a fixing portion 110, an extending portion 120, a rotating portion 130, and an end support portion 140. Hereinafter, respective components will be described in detail with reference to FIGS. 1 to 7.

The fixing portion 110 is a component for fixing the support 100 for the mobile device to the mounted portion 1 of the mobile device or the case of the mobile device. Such a fixing portion 110 may be provided between the mounted portion 1 and the rotating portion 130 as illustrated in FIG. 1.

For example, as illustrated in FIG. 1, the fixing portion 110 may include a fixing member 111 and a double-sided tape (not illustrated). The fixing member 111 may fix the rotating portion 130 to one surface thereof and the double-sided tape (not illustrated) may attach the other surface of the fixing member 111 to the mounted portion 1. Accordingly, through the fixing member 111 and the double-sided tape (not illustrated), the rotating portion 130 of the support 100 for the mobile device of the present invention may be firmly fixed to the mounted portion 1.

As another example, although not illustrated, the fixing portion may include a fixing member, a magnet, and a magnet response member. The fixing member may fix the rotating portion to one surface thereof, the magnet may be provided on any one of the fixing portion and the mounted portion, and the magnet response member may be provided on the other one of the fixing portion and the mounted portion and made of a material responding to the magnet. Here, the material responding to the magnet may be a magnet having a polarity opposite to that of the aforementioned magnet and may be a ferromagnetic material such as iron, nickel, and cobalt. Accordingly, through the magnet and the like, the rotating portion 130 of the support 100 for the mobile device of the present invention may be not only firmly fixed to the mounted portion 1, but also removed from the mounted portion 1 by applying an external force larger than the magnetic force, and thus the support 100 for the mobile device may be mounted on the mounted portion 1 only when necessary.

As another example, although not illustrated, the fixing portion may include a first fixing member and a second fixing member. The first fixing member may be attached to the mounted portion through the double-sided tape, one surface of the second fixing member may be detachably provided on the first fixing member, and the rotating portion may be fixed to the other surface of the second fixing member. For reference, although not illustrated, for a detachable structure, a rail is provided on one surface of the second fixing member and a rail guider may be provided on the first fixing member to correspond to the rail. Accordingly, when the first and second fixing members are detachable from each other and the first fixing member remaining on the mounted portion during detaching is selected as a material such as plastic or the like which is not obstructed by wireless charging, the wireless charging may be smoothly performed through a wireless charger.

The extending portion 120 is a component for substantially adjusting the height of the mobile device 1. As illustrated in FIG. 1, the extending portion 120 may be mounted on the rotating portion 130 and the length may be extended while being drawn in or out in the longitudinal direction. As another example, although not illustrated, when there is no rotating portion 130, the extending portion 120 may be provided on the fixing portion 110.

Accordingly, the length of the extending portion 120 is extended or contracted in the longitudinal direction of the extending portion 120 to easily adjust the position of the mobile device 1 to a desired position of the user and maintain the mobile device 1 at the adjusted portion for a long time by the support through the extending portion 120 together with the end support portion 140. In addition, the length of the extending portion 120 is minimized so as to easily carrying the support together with the mobile device 1 during carrying.

For example, as illustrated in FIGS. 1 to 4, the extending portion 120 may have a slidable structure in which a plurality of sliding members S10 having a plate shape and different widths are drawn in or out each other. Accordingly, the thickness (see FIG. 5) of the support 100 for the mobile device of the present invention may be thinly implemented through the plate shape, and when the support 100 for the mobile device is pulled in the longitudinal direction, the support is extended and when the support 100 for the mobile device is pressed in an opposite direction, the support may be contracted, and thus the adjustment of the length may be facilitated.

Particularly, as illustrated in FIGS. 1 to 4, the extending portion 120 may include a first sliding member S11, a second sliding member S12, and a moving guide portion M10. The first sliding member S11 has a plate shape, one end may be provided on the rotating portion 130, the second sliding member S12 has a plate shape and has a larger than the first sliding member S11, and the moving guide portion M10 may guide the sliding of the first sliding member S11 in the longitudinal direction with respect to the second sliding member S12. Accordingly, the first and second sliding members S11 and S12 may be smoothly drawn in or out each other in the longitudinal direction without moving left and right through the moving guide portion M10.

Further, as illustrated in FIGS. 2 and 4, the moving guide portion M10 may include a drawing in-out receiving portion M11, a guide groove M12, and a guide protrusion M13. The drawing in-out receiving portion M11 may be provided in the second sliding member S12 so that the first sliding member S11 is drawn in or out in a received form. The guide groove M12 may be elongated in a longitudinal direction to be drawn in or out to or from an inner surface of the drawing in-out receiving portion M11. Of course, although not illustrated, as another example, the guide groove may be formed on an outer surface of the first sliding member and the guide protrusion may also be formed on the inner surface of the drawing in-out receiving portion.

Accordingly, the first sliding member S11 may be drawn in or out while being received in the drawing in-out receiving portion M11 provided in the second sliding member S12, and even if the first and second sliding members S11 and S12 are drawn in to each other to overlap with each other, it is possible to minimize the thickness of the extending portion 120, and eventually implement a smaller thickness (see FIG. 5) of the support 100 for the mobile device of the present invention.

Further, the extending portion 120 may further include a slip-off preventing portion L10 as illustrated in FIGS. 2 to 4. The slip-off preventing portion L10 may serve to prevent the slip-off of the first sliding member S11 from the second sliding member S12 while the first sliding member S11 is maximally drawn out from the second sliding member S12.

For example, the slip-off preventing portion L10 may include a latching member L11 and a latching jaw L12. The latching member L11 may have a pin shape may be detachably provided on the outer surface of the first sliding member S11, and the latching jaw L12 may be provided on the inner surface of the second sliding member S12 in a stepped form so as to latch the latching member L11. Of course, although not illustrated, as another example, a latching member may be provided on the inner surface of the second sliding member and a latching jaw may be provided on the outer surface of the first sliding member.

Accordingly, even if the first sliding member S11 is pulled by the user to be maximally drawn out from the second sliding member S12, the latching member L11 is latched on the latching jaw L12 to prevent the first sliding member S11 from being removed from the second sliding member S12.

Further, the extending portion 120 may further include a moving stop portion H10 as illustrated in FIGS. 1 to 3. The moving stop portion H10 may serve to stop the movement of the first sliding member S11 while the first sliding member S11 is drawn out from the second sliding member S12.

For example, the moving stop portion H10 may include a stop protrusion (see H11 of FIG. 3) and a stop groove H12 as illustrated in FIGS. 1 and 3. The stop protrusion (see H11 of FIG. 3) may be elastically supported by the first sliding member S11 and the stop groove H12 may be formed on the second sliding member S12 so as to be inserted with the stop protrusion (see H11 of FIG. 3). Of course, although not illustrated, as another example, a stop protrusion may be provided on the second sliding member and a stop groove may be provided on the first sliding member.

Accordingly, the moving stop portion may stop the movement of the first sliding member S11 while the first sliding member S11 is drawn out from the second sliding member S12 to prevent the first sliding member S11 from sliding downward along the second sliding member S12 by the load. Particularly, although not illustrated, in the case where a plurality of stop grooves is provided at intervals in the longitudinal direction of the first sliding member, the stop protrusion is selectively inserted to any one of the plurality of stop grooves to stop the movement at a desired position of the user.

Further, as illustrated in FIGS. 1 to 4, the extending portion 120 may further include a third sliding member S13 which has a width larger than that of the second sliding member S12 and guides the second sliding member S12 to be movable in the longitudinal direction thereof. Accordingly, the extending portion 120 may be drawn out to a sufficient length through the third sliding member S13. Of course, although not illustrated, in order to further extend the length, the extending portion may also include at least four sliding members.

The rotating portion 130 is a component which relatively rotates the fixing portion 110 with respect to the extending portion 120 and provides a rotation motion with respect to the mobile device 1. Such a rotating portion 130 may be provided between the fixing portion 110 and the extending portion 120 as illustrated in FIGS. 1, 3, and 6.

Specifically, the rotating portion 130 may include a roll rotating portion R10 as illustrated in FIG. 6. The roll rotating portion R10 may be provided on the fixing portion 110 and rotate the fixing portion 110 clockwise or counterclockwise when viewing a display of the mobile device 1 from the front side and serve to implement a roll motion with respect to the mobile device 1. For example, as illustrated in FIG. 6, the roll rotating portion R10 may include a roll hinge shaft R11 provided on the fixing portion 111 and a roll rotating member R12 rotatably provided on the roll hinge shaft R11.

Furthermore, the rotating portion 130 may include a pitch rotating portion P10 as illustrated in FIG. 6. The pitch rotating portion P10 may be provided on the roll rotating portion R10 and may tilt the roll rotating portion R10 in a vertical direction when viewing the mobile device 1 from the side and implement a pitch motion with respect to the mobile device 1. For example, as illustrated in FIG. 6, the pitch rotating portion P10 may include a pitch hinge shaft P11 provided on the front end of the extending portion 120 and a rotation guiding hole (not illustrated) which is provided on the roll rotating member R12 and rotatably inserted with the pitch hinge shaft P11.

The end support portion 140 is a component for supporting the support 100 for the mobile device of the present invention on the bottom. As illustrated in FIGS. 1, 5, and 7, the end support portion 140 may be rotatably provided at the end of the extending portion 120 in forward and backward directions.

Particularly, the end support portion 140 is rotated in the forward direction at the end of the extending portion 120 to cover the extending portion 120 when the extending portion 120 is drawn in (see FIG. 5), and the end support portion 140 is rotated in the backward direction at the end of the extending portion 120 to support the extending portion 120 when the extending portion 120 is drawn out (see FIG. 1)

Furthermore, as illustrated in FIGS. 1 and 7, the end support portion 140 may include an end support member 141 and a support area expanding member 142. The end support member 141 may be rotatably provided at the end of the extending portion 120, and the support area expanding member 142 may be rotatably provided on the end support member 142 and separated from one side of the end support member 141 in the case of supporting the extending portion 120 to expand a support area. Accordingly, the end support member 141 rotates the support area expanding member 142 in a separated direction at one side of the end support member 141 to expand the support area, thereby more stably supporting the mobile device 1.

Further, as illustrated in FIG. 7, the end support member 141 may further include a receiving groove 141a for the extending portion which is recessed in the lower surface thereof. Accordingly, when the end support member 141 is rotated in the forward direction to cover the extending portion (see FIG. 5) after the extending portion 120 is fully drawn in, the extending portion 120 may be received in the receiving groove 141a for the extending portion, thereby minimizing the thickness of the support 100 for the mobile device of the present invention during carrying.

In addition, the support 100 for the mobile device according to the embodiment of the present invention may further include an inclination retention protrusion 150 provided at the end of the extending portion 120, as illustrated in FIGS. 1 to 3. Accordingly, when the end support portion 140 is rotated in the backward direction at the end of the extending portion 120, the end support portion 140 may be latched on the extending portion 120 in an inclined state through the inclination retention protrusion 150.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

EXPLANATION OF REFERENCE NUMERALS AND SYMBOLS

1: Mounted portion (mobile device or case)
100: Support for mobile device
110: Fixing portion
111: Fixing member
120: Extending portion
S10: A plurality of sliding members
S11: First sliding member
S12: Second sliding member
S13: Third sliding member
M10: Moving guide portion
M11: Drawing in-out receiving portion
M12: Guide groove
M13: Guide protrusion
L10: Slip-off preventing portion
L11: Latching member
L12: Latching jaw
H10: Moving stop portion
H11: Stop protrusion
H12: Stop groove
130: Rotating portion
R10: Roll rotating portion
R11: Roll hinge shaft
R12: Roll rotating member
P10: Pitch rotating portion
P11: Pitch hinge shaft
P12: Rotation guide hole
140: End support portion
141: End support member
141a: Receiving groove for extending portion
142: Support area expanding member
150: Inclination retention protrusion

The invention claimed is:

1. A support for a mobile device which is provided on a mounted portion of a mobile device or a case of the mobile device to support the mobile device, comprising:

a fixing portion provided on the mounted portion;
an extending portion extended while being drawn in or out in a longitudinal direction;
a rotating portion provided between the fixing portion and the extending portion to relatively rotate the fixing portion; and
an end support portion rotatably provided at an end of the extending portion, the end support portion including an end support member rotatably provided at the end of the extending portion,
wherein the end support portion is rotated in a forward direction at the end of the extending portion to cover the extending portion upon the extending portion being drawn in,
wherein the end support member includes a receiving groove for receiving the extending portion, wherein the receiving groove is recessed in a surface facing the extending portion to receive the extending portion upon the end support member configured to cover the extending portion, wherein the extending portion has a plurality of sliding members, each of which having a plate shape and a different width so that each of the plurality of sliding members is drawn in or out to or from each other,
wherein the plurality of sliding members include:
a first sliding member of which one end is connected to the fixing portion;
a second sliding member having a width larger than the first sliding member; and
a moving guide portion which guides the sliding of the first sliding member to the second sliding member in a longitudinal direction thereof;
wherein the moving guide portion includes:
a drawing in-out receiving portion which is provided in the second sliding member so that the first sliding member is drawn in or out in a received form;
a guide groove which is provided on any one of an inner surface of the drawing in-out receiving portion and an outer surface of the first sliding member; and
a guide protrusion which is provided on the other one of the inner surface of the drawing in-out receiving portion and the outer surface of the first sliding member so as to correspond to the guide groove.

2. A support for a mobile device which is provided on a mounted portion of a mobile device or a case of the mobile device, comprising:

a fixing portion provided on the mounted portion;
an extending portion which is provided on the fixing portion and extended while being drawn in or out in a longitudinal direction; and
an end support portion rotatably provided at an end of the extending portion, the end support portion including an end support member rotatably provided at the end of the extending portion,
wherein the end support portion is rotated in a forward direction at the end of the extending portion to cover the extending portion upon the extending portion being drawn in,
wherein the end support member includes a receiving groove for receiving the extending portion, wherein the receiving groove is recessed in a surface facing the extending portion to receive the extending portion upon the end support member configured to cover the extending portion,
wherein the extending portion has a plurality of sliding members, each of which having a plate shape and a different width so that each of the plurality of sliding members is drawn in or out to or from each other,
wherein the plurality of sliding members include:
a first sliding member of which one end is connected to the fixing portion;
a second sliding member having a width larger than the first sliding member; and
a moving guide portion which guides the sliding of the first sliding member to the second sliding member in a longitudinal direction thereof,
a third sliding member having a width larger than the second sliding member, one end of the third sliding member connected to the end support portion;
wherein the moving guide portion includes:
a drawing in-out receiving portion which is provided in the second sliding member so that the first sliding member is drawn in or out in a received form;
a guide groove which is provided on any one of an inner surface of the drawing in-out receiving portion and an outer surface of the first sliding member; and
a guide protrusion which is provided on the other one of the inner surface of the drawing in-out receiving portion and the outer surface of the first sliding member so as to correspond to the guide groove.

\* \* \* \* \*